(12) United States Patent
Korkowski et al.

(10) Patent No.: US 6,399,889 B1
(45) Date of Patent: Jun. 4, 2002

(54) HEAD INTERCONNECT CIRCUIT WITH ALIGNMENT FINGER

(75) Inventors: Kurt J. Korkowski, Hudson, WI (US); Kenneth R. Fastner, Inver Grove Heights, MN (US); Adam K. Himes, Richfield, MN (US); Gregory P. Myers, Edina, MN (US); Andrew R. Motzko, Burnsville, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/394,153

(22) Filed: Sep. 13, 1999

Related U.S. Application Data

(60) Provisional application No. 60/100,246, filed on Sep. 14, 1998.

(51) Int. Cl.[7] .............................. H05K 1/00; H05K 1/03
(52) U.S. Cl. ..................... 174/255; 174/261; 174/254; 361/741; 361/743; 361/772; 361/776; 361/803
(58) Field of Search ................. 174/255, 254, 174/256, 261, 268, 117 FF; 361/741, 749, 756, 772, 774, 776, 777, 784, 803, 743, 736; 439/67

(56) References Cited

U.S. PATENT DOCUMENTS

| 5,012,368 A | * | 4/1991 | Bosier et al. ............ 360/264.2 |
| 5,103,359 A | * | 4/1992 | Marazzo ................... 360/264.2 |
| 5,422,764 A | * | 6/1995 | McIlvanie ................. 360/97.01 |
| 5,631,788 A | * | 5/1997 | Richards ................... 360/264.2 |
| 5,661,896 A | * | 9/1997 | Erpelding ................. 29/603.01 |
| 5,668,684 A | * | 9/1997 | Palmer et al. ............ 360/264.2 |
| 5,859,749 A | | 1/1999 | Zarouri et al. .............. 360/104 |
| 5,909,342 A | * | 6/1999 | Forbord et al. .......... 360/264.2 |
| 5,917,149 A | | 6/1999 | Barclay et al. ................ 174/35 |
| 5,920,465 A | * | 7/1999 | Tanaka ......................... 361/784 |
| 5,924,873 A | | 7/1999 | Barclay et al. ................ 439/67 |
| 6,036,813 A | * | 3/2000 | Schulz et al. ............ 156/307.7 |

\* cited by examiner

*Primary Examiner*—Jeffrey Gaffin
*Assistant Examiner*—Ishwar Patel
(74) *Attorney, Agent, or Firm*—Westman, Champlin & Kelly, P.A.

(57) ABSTRACT

A head interconnect circuit for connecting transducer elements of a data head to drive circuitry including an alignment finger on a lead tip for aligning leads relative to connectors or solder pads for electrically connecting heads to drive circuitry. A method for connecting a head interconnect circuit to a printed circuit supported on an head actuator including aligning an alignment finger on the lead tip with a printed surface of a drive circuit for soldering leads on the lead tip to solder pads or connectors on the drive circuit.

19 Claims, 8 Drawing Sheets

HEAD INTERCONNECT CIRCUIT WITH ALIGNMENT FINGER

CROSS-REFERENCE TO RELATED APPLICATION

The present application claims priority to Provisional Application Serial No. 60/100,246 filed Sep. 14, 1998, and entitled "HEAD GIMBAL ASSEMBLY INTERCONNECT ALIGNMENT".

FIELD OF THE INVENTION

The present invention relates to a data storage device. In particular, the present invention relates to a head interconnect circuit for electrically connecting transducer elements of a data storage device to process circuitry for read or write operations.

BACKGROUND OF THE INVENTION

Disc drive systems are well known which include data heads including transducer elements for reading or writing data to a recordable disc. Transducer elements of the data heads are electrically connected to drive circuitry through a head interconnect circuit. Conductive paths on the head interconnect circuit electrically connect head leads connected to transducer elements on the head to circuit leads connected to drive circuitry.

Heads are supported relative to a disc surface by a head actuator or E-block. A drive circuit is mounted on the head actuator and circuit leads on the head interconnect circuit are connected to lead connectors or solder pads on the drive circuit. Leads are supported along an edge of a lead tip of the head interconnect circuit and connectors or solder pads are aligned along a slot or edge of the drive circuit. The lead tip is inserted into the slot or aligned with the edge to connect circuit leads to connectors. Leads are soldered to connectors to electrically connect transducer elements of the head to drive circuitry.

Prior to soldering, leads are aligned with the connectors or solder pads to assure desired electrical connection for read and write operations. Drive circuits mounted on a head actuator or E-block include a conductive metal substrate supporting a printed circuit. During soldering operation, solder can spill from the solder pad or connector. Solder spill to a conductive metal substrate can short the electrical connection between the data heads and drive circuitry so that the data heads are defective. The present invention addresses these and other problems, and offers other advantages over the prior art.

SUMMARY OF THE INVENTION

A head interconnect circuit for connecting transducer elements of a data head to drive circuitry including an alignment finger for aligning leads relative to lead connectors or solder pads for electrically connecting heads to drive circuitry.

The drawings are for illustration and the features illustrated therein are not necessarily drawn to scale.

DETAILED DESCRIPTION OF THE PREFERRED EMBODIMENTS

Figure 1:
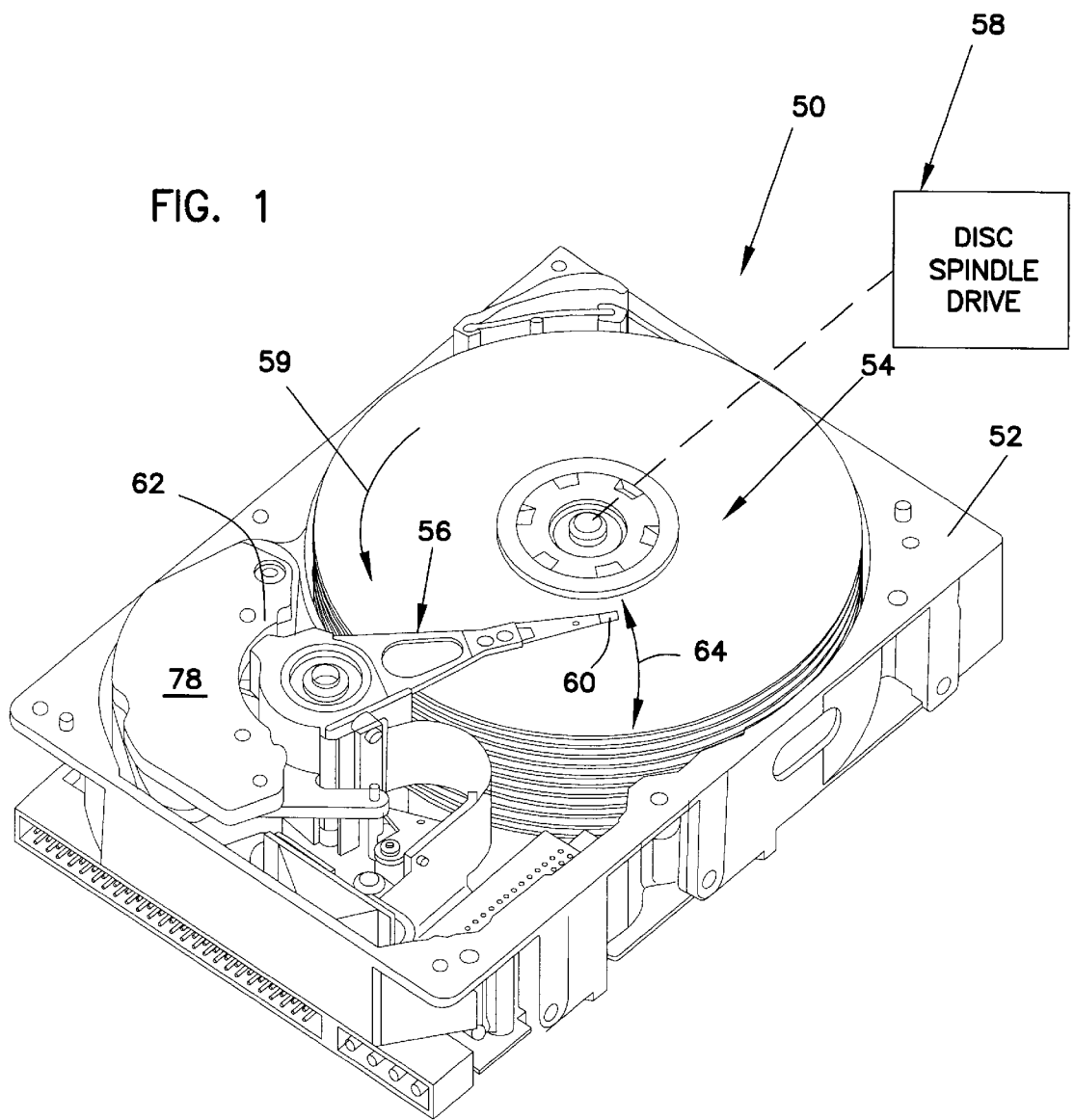
FIG. 1 is a perspective illustration of a disc drive.

FIG. 1 illustrates a rotary disc drive 50 including a disc chassis 52, discs 54 and a head actuator or E-block 56. Discs 54 are rotationally coupled to chassis 52 via a disc spindle drive 58 (illustrated diagrammatically) for rotation, as illustrated by arrow 59. Discs store data on concentric data tracks. The head actuator 56 supports data heads 60 relative to a disc surface. In FIG. 1, head actuator 56 is rotated via operation of voice coil motor (VCM) 62 to move heads 60 along an arcuate path as illustrated by arrow 64 to position heads 60 relative to selected data tracks for read or write operations.

Figure 2:
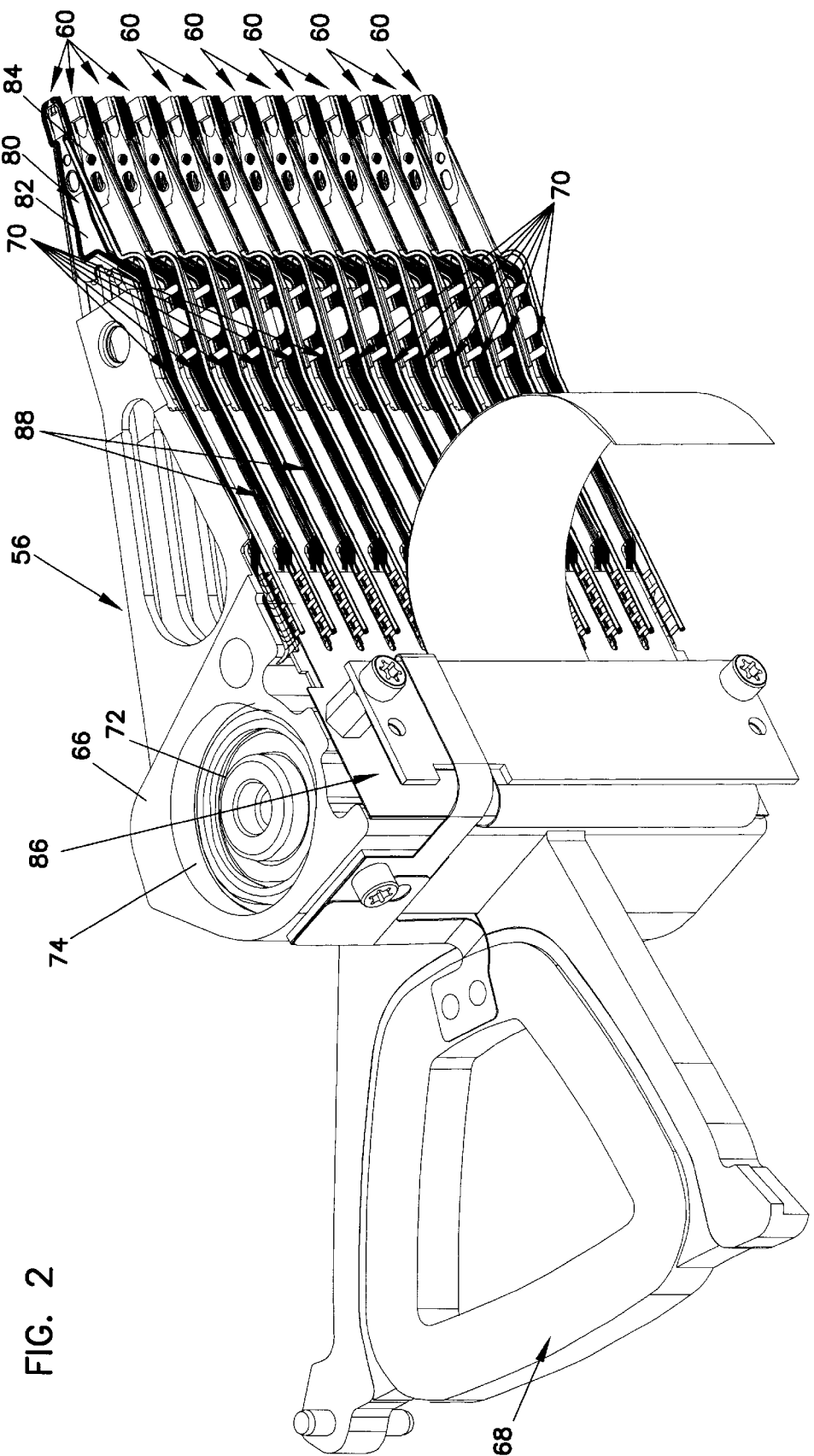
FIG. 2 is a perspective illustration of an actuator block supporting heads for read or write operations.

FIG. 2 is a perspective illustration of an embodiment of a head actuator 56 supporting heads 60. As shown in FIG. 2, head actuator 56 includes a stem 66, a motor coil 68 and a plurality of stacked actuator arms 70. A bearing 72 or other pivot connection rotationally connect actuator 56 to chassis 52. Bearing 72 extends through a bearing channel 74 in the stem 66 to rotationally connect actuator 56 to rotationally support heads 60 for placement relative to selected data tracks. Motor coil 68 is supported for operation in a backiron assembly 78 (illustrated in FIG. 1) to form the VCM 62 for moving head actuator 56 along path 64 for head placement relative to selected data tracks.

Flexible suspension assemblies 80 are coupled to and extend from the actuator arms 70 to support a plurality of heads 60 relative to the disc surface. The suspension assemblies 80 illustrated in FIG. 2 include a load beam 82 and a gimbal spring 84. The load beam 82 and gimbal spring 84 flexibly support heads 60 relative to the disc surface to follow the topography of the disc surface. Heads 60 include transducer elements for read or write operations. Transducer elements can be inductive type transducer elements, magneto-resistive and magneto-optical transducer elements. Transducer elements are electrically connected to a drive circuit 86 connected to head actuator 56 via a head interconnect circuit 88.

Figure 3:
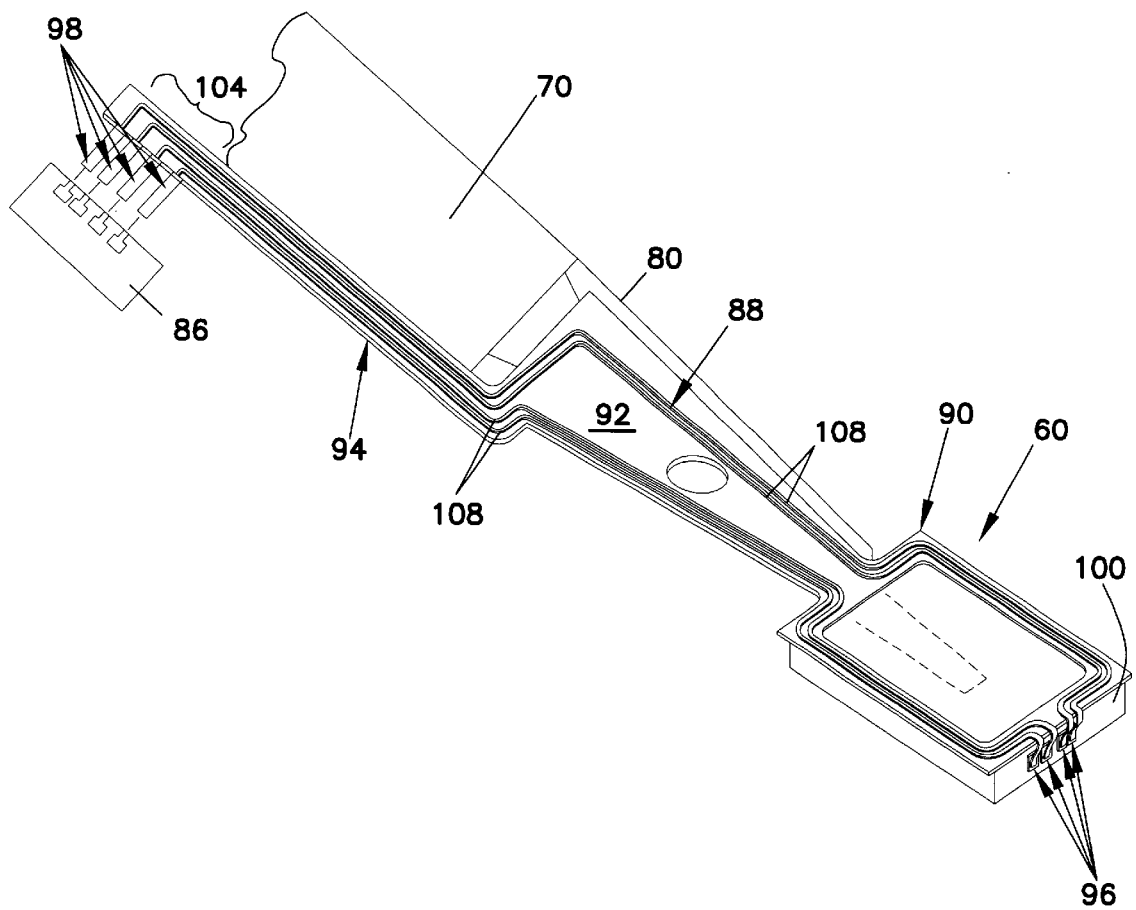
FIG. 3 is a perspective illustration of a head interconnect circuit.

FIG. 3 is a detailed illustration of an embodiment of a head interconnect circuit 88. The embodiment shown includes base 90 having a body portion 92, and a tail 94; a plurality of head leads 96 and circuit leads 98. Head leads 96 are formed at an end of body portion 92 to electrically connect to transducer elements supported on slider 100. Tail 94 extends from body portion 92 to a lead tip 104 supporting circuit leads 98. A portion of the tail 94 extends along an actuator arm 70 to position lead tip 104 proximate to the drive circuit 86 (illustrated schematically in FIG. 3). Conductive paths 108 on base 90 electrically connect head leads 96 to the circuit leads 98 for connecting transducer elements to drive circuit 86 for read/write operations. Base 90 is typically formed of a flexible polyimide material and the conductive paths 108 are formed of copper traces. The number of leads 96, 98 and paths 108 depends upon the number of electrical connections required for the transducer elements supported by the slider 100.

Figure 4:
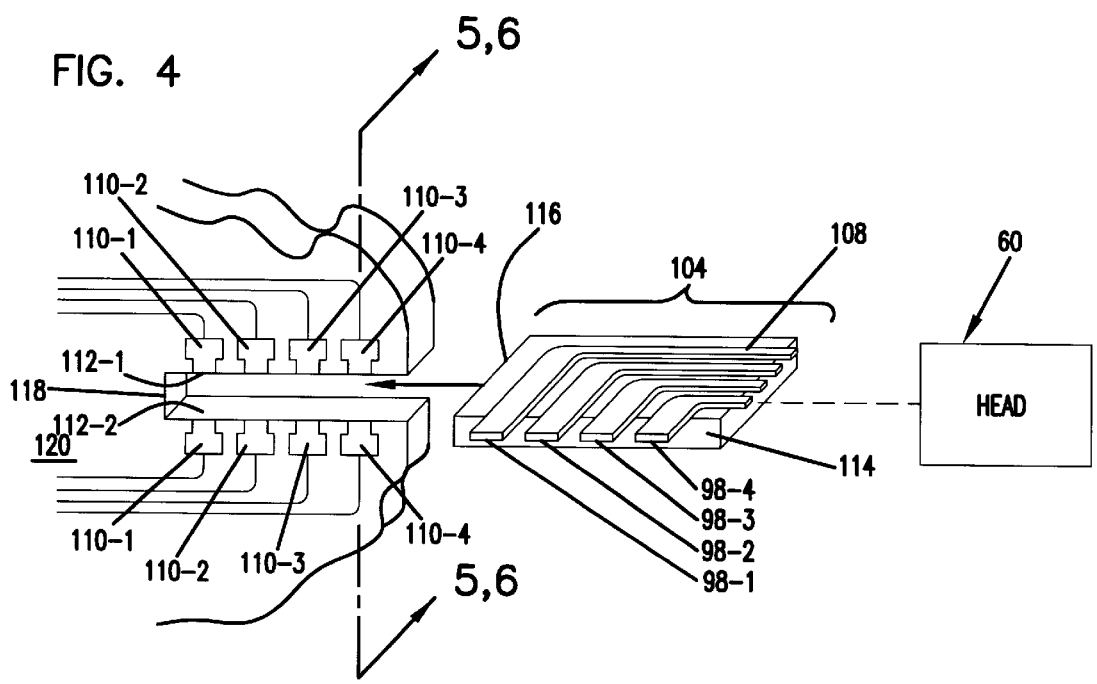
FIG. 4 is a detailed perspective illustration of a lead tip of a head interconnect circuit and solder pads on a drive circuit.

As shown in FIG. 4, drive circuit 86 includes series of solder pads or connectors 110-1, 110-2, 110-3, 110-4 extending along a length of an interconnect slot 112 for connecting circuit leads 98-1, 98-2, 98-3, 98-4 to drive circuitry. In the embodiment shown, upper and lower lead pads 110-1, 110-2, 110-3, 110-4 are aligned along upper and lower slot edges 112-1, 112-2 to connect circuit leads 98-1, 98-2, 98-3, 98-4 for upper and lower head interconnect circuits 88-1, 88-2 as shown in FIG. 5 to electrically connect heads supported by upper and lower suspension assemblies 80 connected to an actuator arm 70.

Circuit leads 98 extend along a lead edge 114 of lead tip 104 as shown in FIG. 4 and are spaced from end 116 to align each circuit lead 98-1, 98-2, 98-3, 98-4 with a solder pad or connector 110-1, 110-2, 110-3, 110-4. In the embodiment illustrated in FIGS. 4–5, lead tip 104 is inserted into slot 112 so that an end 116 of the lead tip 104 abuts an end 118 of slot 112. Leads 98 are sequentially spaced along edge surface 114 from end 116 to align with pads 110-1, 110-2, 110-3, 110-4 when end 116 abuts end 118 of drive circuit 98. As shown, in FIGS. 4–5, leads 98 are bent and soldered to pads 110. Alternatively pads 110-1, 110-2, 110-3, 110-4 can be spaced along an exposed edge surface (not shown) for connection of leads to drive circuitry.

Figure 5:
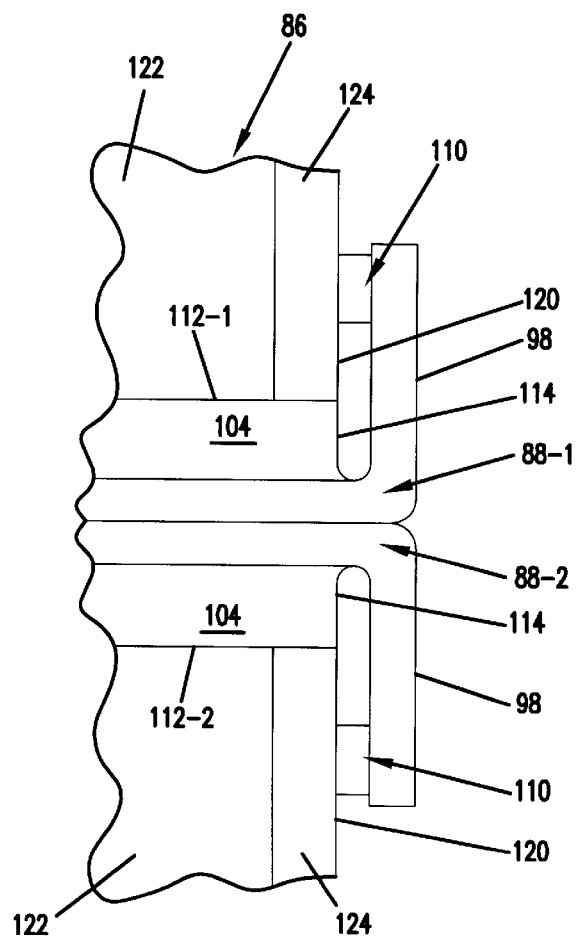
FIG. 5 is a cross-sectional view of leads from multiple head interconnect circuits soldered to solder pads of a drive circuit as generally taken along line 5,6—5,6 of FIG. 4.
Figure 6:
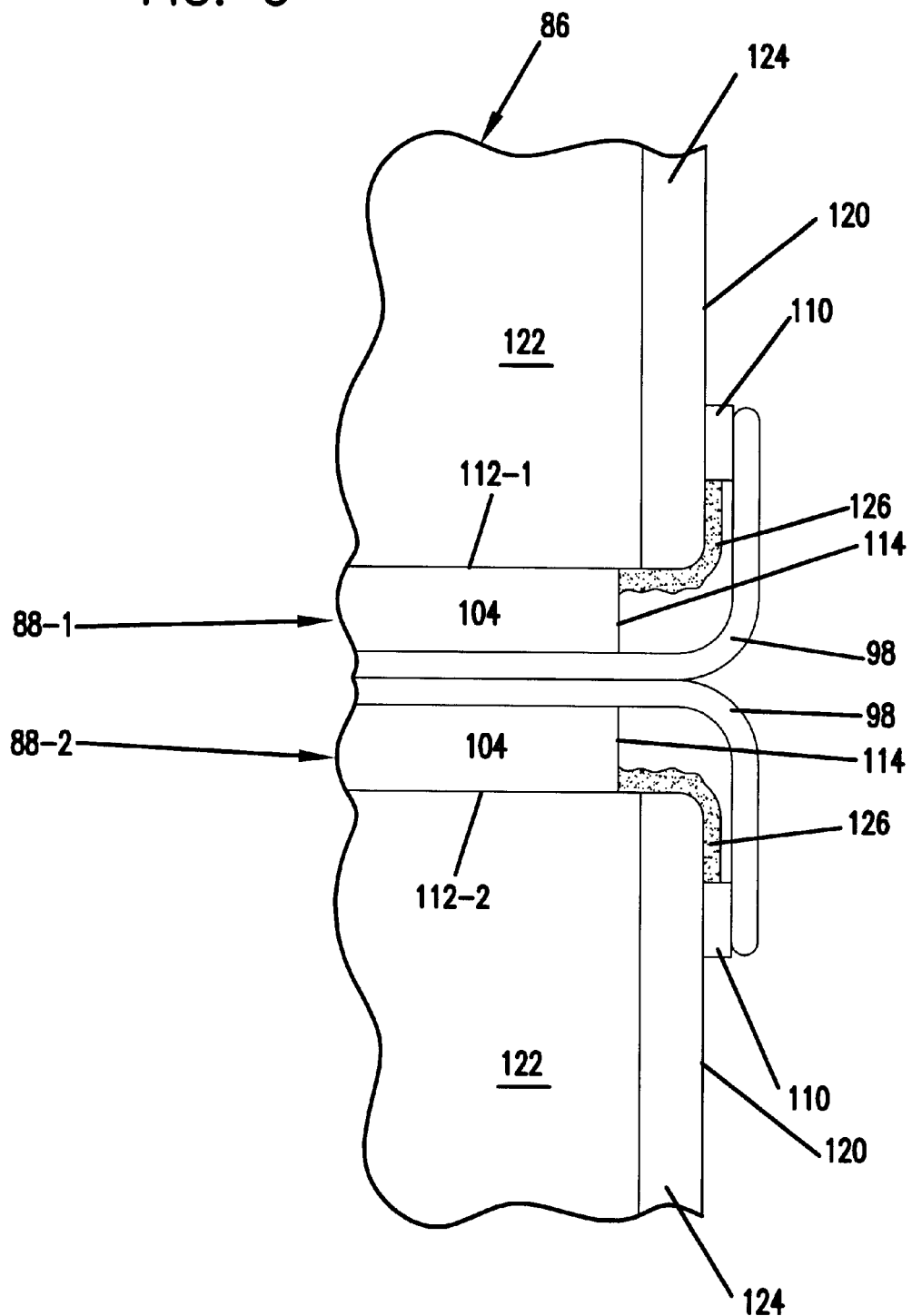
FIG. 6 is an alternate cross-sectional view of leads from multiple head interconnect circuits soldered to solder pads of a drive circuit as generally taken along lines 5,6—5,6 of FIG. 4.

As comparatively shown in FIGS. 5–6, the elevation of edge 114 relative to a printed surface 120 (reference surface) of circuit 86 affects placement of leads 98 relative to pads 110. As shown in FIG. 5, edge 114 is flush with printed surface 120 and in FIG. 6, edge 114 is out-of-alignment with or lower than printed surface 120. Alternatively, edge 114 can be raised relative to the printed surface 120. During the soldering process, solder can spill from the solder pads 110 as illustrated diagrammatically in FIG. 6. The drive circuit 86 shown in FIGS. 5–6 is a rigid printed circuit board formed of a metal plate 122, such as Aluminum or stainless steel, and an insulating layer 124 such as polyimide. Although a particular circuit board construction is described, the circuit board is not limited to the specific construction or materials described. Circuit paths 108 and solder pads 110 are formed on insulating layer 124. Depending upon the alignment of edge 114 with printed surface 120 solder spill can interfere with and potentially short the electrical connection between the head and drive circuitry.

Figure 7:
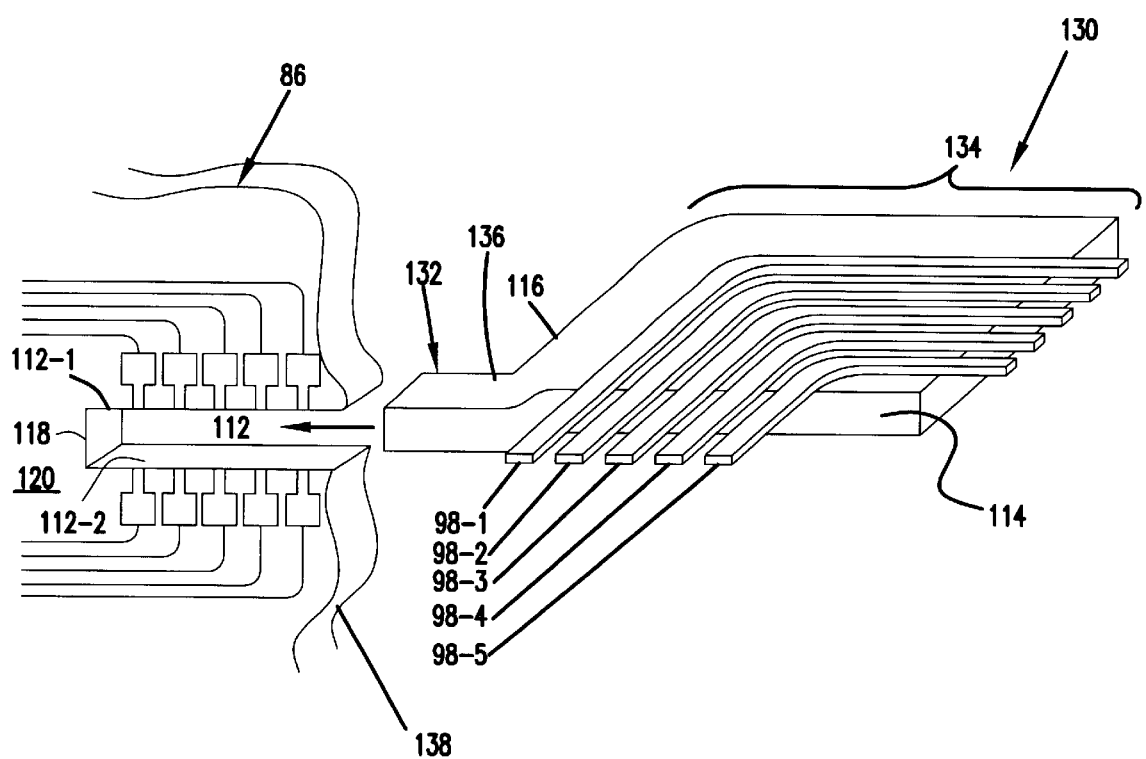
FIG. 7 is a perspective illustration of an embodiment of a lead tip of a head interconnect circuit of the present invention including an alignment finger.
Figure 8:
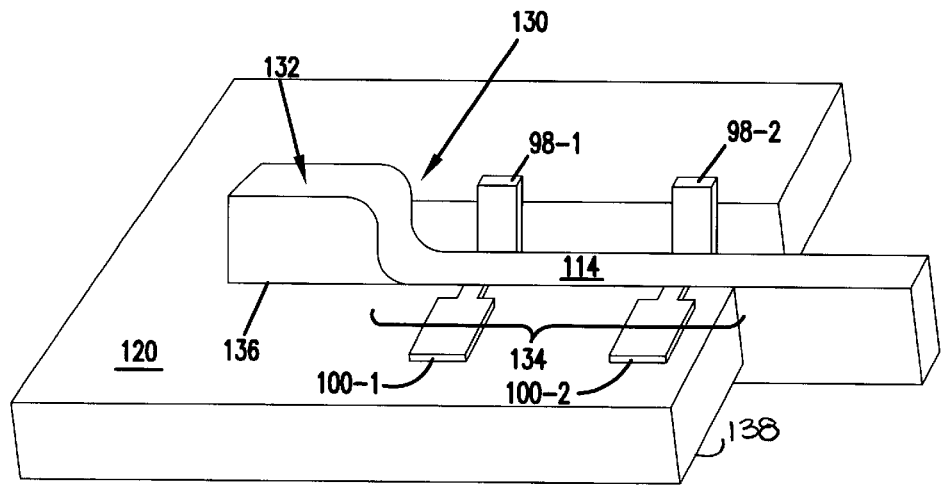
FIG. 8 is a schematic illustration of the alignment finger of FIG. 7 having an alignment edge aligned with a printed surface of a drive circuit.

In particular, as shown in FIG. 6, when edge 114 is lower than printed surface 120, solder spill 126 can contact the metal plate 122 of the circuit board shorting the head so that the head is defective. The present invention relates to a head interconnect circuit 130 with an alignment feature for aligning lead edge 114 relative to the printed surface 120 or connector of drive circuit 86. An embodiment of the head interconnect circuit 130 is illustrated in FIGS. 7–9 where like numbers are used to identify like parts of head interconnect circuit 88.

In the embodiment shown, the alignment feature includes an alignment finger 132 on lead tip 134 having an alignment edge 136 for aligning lead edge 114 with printed surface 120 or connectors 110. In the embodiment shown, alignment edge 136 is co-planar with and aligned with edge 114 on lead tip 134. As shown in FIGS. 7–8, the alignment finger 132 is inserted into the slot 112 to align the edge 136 with the printed surface 120 or reference surface of the drive circuit 86. Alignment of edge 136 with reference surface aligns edge 114 with printed surface 120 and solder pads 110 to reduce solder spill to metal plate 122. Alternatively, alignment edge of alignment finger 132 can be located to align with a parallel back surface 138 to align edge 114 with printed surface 120 or connectors 110. Engagement of the finger 132 with back surface 138 can secure the lead tip 134 in place and prevent the lead tip 134 from "popping out".

Figure 9:
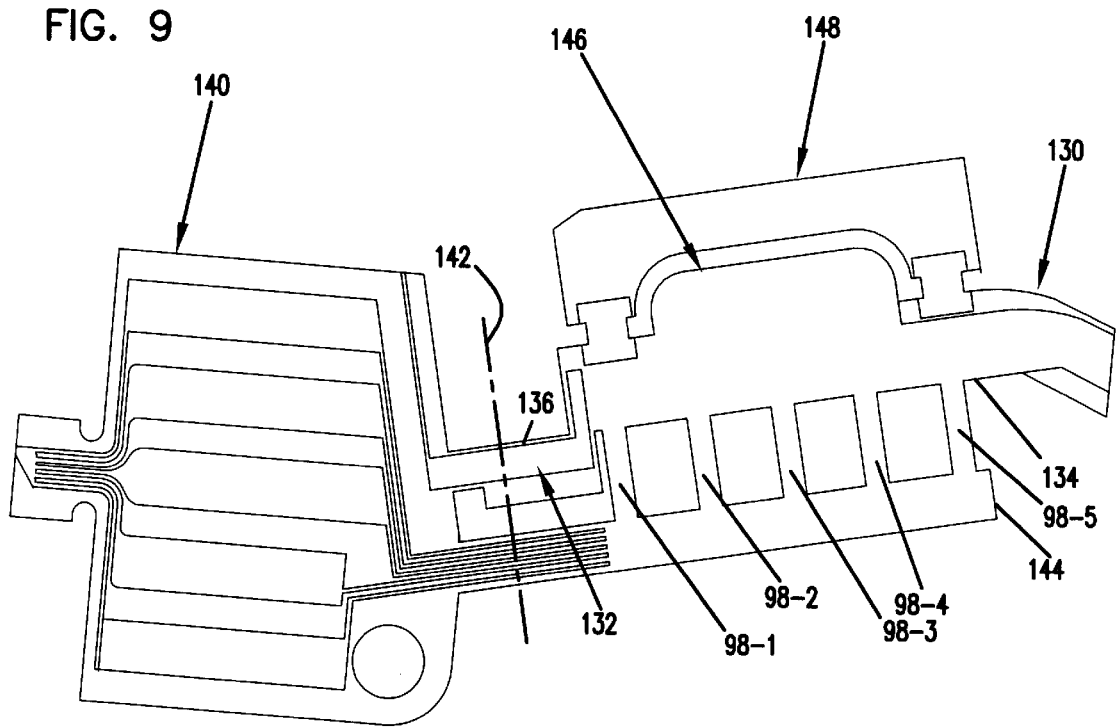
FIG. 9 is a plan view of a lead tip of an embodiment of a head interconnect circuit of the present invention connected to a test connector board prior to assembly in a disc drive.

FIG. 9 is a detailed illustration of lead tip 134. As shown, lead tip 134 is formed integral with a test connector board 140. Connector board 140 is used to test electrical connection of the heads prior to assembly in a disc drive. For assembly, connector board 140 is separated from lead tip 134 as illustrated by line 142 and tab 144 is separated from soldered leads 98. As shown separation of connector board 140 at line 142 forms finger 132. In the embodiment shown, lead tip 134 includes a shoulder 146 and a shoulder flap 148. For assembly shoulder flap 148 is folded behind shoulder 146 and inserted into a slot (not shown) on actuator block 56 to secure lead tips for assembly to drive circuit 86.

Figure 10:
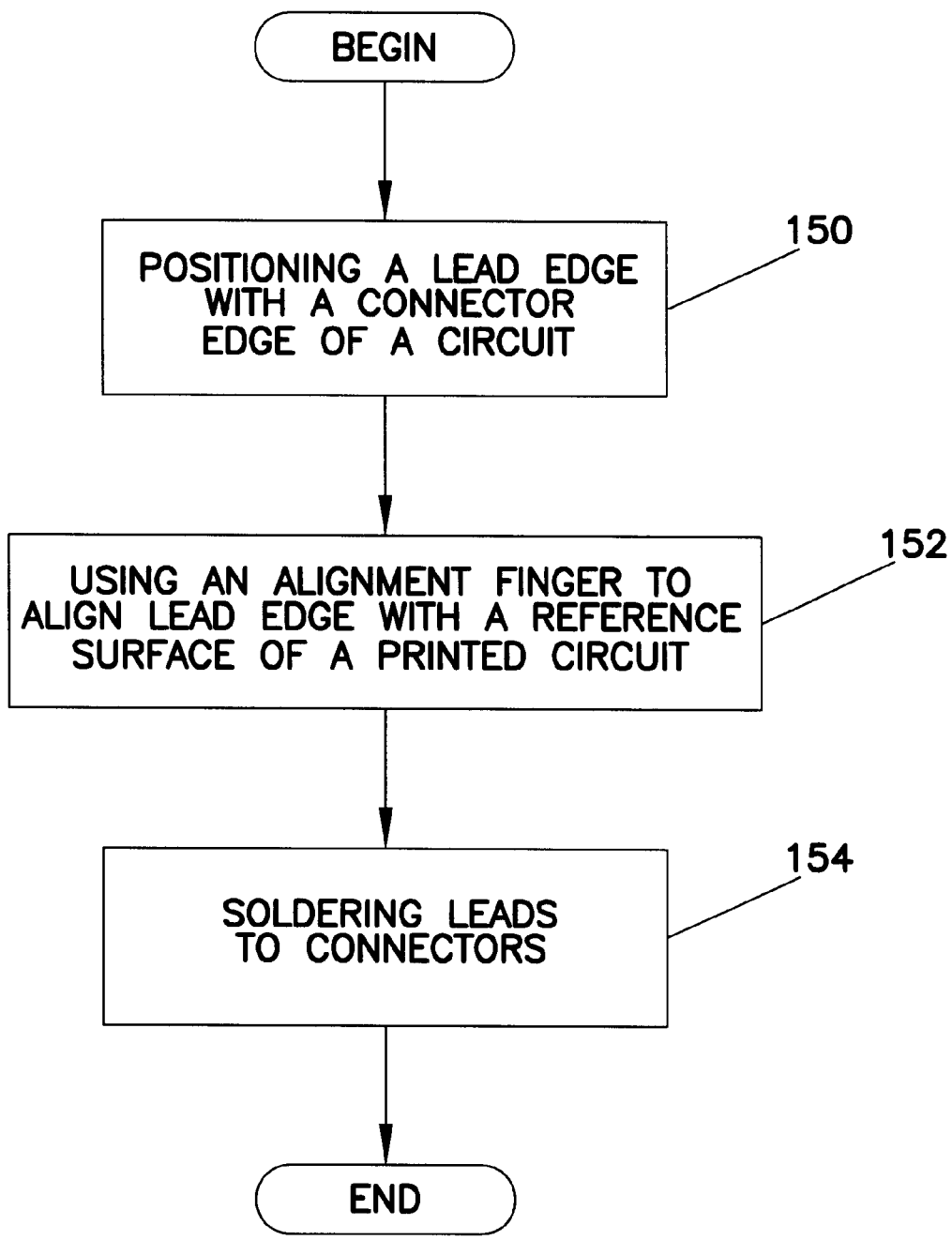
FIG. 10 is an operation flow chart for connection of leads to drive circuitry.

FIG. 10 is a flow chart for assembly. As shown for assembly, a lead edge 114 is aligned with a connector edge 112-1, 112-2 of a printed or drive circuit as illustrated by block 150. Alignment finger 132 is used to align lead edge 114 with a printed surface 120 of the drive circuit 86 as illustrated by block 152 and leads 98 are soldered to connectors or solder pads 110 as illustrated by block 154.

A head interconnect circuit 130 for connecting transducer elements of a data head 60 to drive circuitry including a lead tip 104 having a plurality of leads 98 aligned along a lead edge 114 and an alignment finger 132 for aligning leads 98 relative to connectors or solder pads 110 for connection to drive circuitry.

It is to be understood that even though numerous characteristics and advantages of various embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application while maintaining substantially the same functionality without departing from the scope and spirit of the present invention. In addition, although the preferred embodiment described herein is directed to a magnetic disc drive system, it will be appreciated by those skilled in the art that the teachings of the present invention can be applied to other systems, like an optical data storage system, without departing from the scope and spirit of the present invention.

What is claimed is:

1. A head interconnect circuit for connecting transducer elements of a data head to an interfacing circuit of a disc drive comprising:

an insulated base portion having a base surface and first and second edge surfaces intersecting with the base surface;

a plurality of head leads;

a plurality of circuit leads on the base surface of the base portion sequentially spaced from the first edge surface;

a plurality of conductive paths electrically connecting the head leads and the circuit leads; and an alignment finger having a finger portion extending from the base portion and the finger portion including a third edge surface intersecting the first edge surface to form interfacing surfaces, the first edge surface on the base portion being positionable to align the circuit leads relative to interfacing terminals on the interfacing circuit and the third edge surface of the finger portion being positionable to align the second edge surface of the base portion relative to the interfacing circuit.

2. The head interconnect circuit of claim 1 wherein the base portion is sized for insertion into a slot of the interfacing circuit of the disc drive having solder pads aligned therealong forming the interfacing terminals.

3. The head interconnect circuit of claim 1 wherein the base portion is formed of a flexible material.

4. The head interconnect circuit of claim 1 wherein the base portion is formed of a polyimide material.

5. The head interconnect circuit of claim 1 wherein the conductive paths are formed of copper traces on the base portion.

6. The head interconnect circuit of claim 1 wherein the base portion includes a body portion and the body portion is sized to be mounted on a flexible suspension assembly of a head actuator.

7. The head interconnect circuit of claim 1 wherein the alignment finger is generally rectangular shaped.

8. The head interconnect circuit of claim 1 wherein the third edge surface on the finger portion of the finger and the first edge surface of the base portion are generally perpendicular.

9. The head interconnect circuit of claim 1 wherein the third edge surface on the finger portion and the second edge surface of the base portion are generally parallel.

10. The head interconnect circuit of claim 1 wherein the base portion includes a body portion and a tail portion.

11. The head interconnect circuit of claim 1 wherein the head leads, the circuit leads and the conductive paths are printed on the base surface.

12. A head interconnect circuit for connecting transducer elements of a data head to drive circuitry comprising:

a base portion including a plurality of leads on a base surface of the base portion to connect the transducer elements to the drive circuitry;

means for aligning the base portion of the head interconnect circuit relative to an interface circuit having interface terminals thereon for connecting the leads to the drive circuitry.

13. The head interconnect circuit of claim 12 wherein the interface circuit of the drive circuitry includes a conductive substrate and the means for aligning includes a finger having an alignment edge to align an edge surface of the base portion relative to a printed surface of the interface circuit to limit solder flow to the conductive substrate of the interface circuit.

14. The head interconnect circuit of claim 12 wherein the means for aligning includes a finger including an alignment edge for positioning an edge surface of the base portion intersecting the base surface of the base portion relative to a printed surface of the interface circuit having the interface terminals thereon.

15. The head interconnect circuit of claim 12 and the means for aligning comprises an edge surface on the base portion for aligning the leads on the base portion with the interface terminals spaced along the interface circuit.

16. In combination:

an interface circuit including a plurality of terminals spaced along a surface of the interface circuit; and a head interconnect circuit including an insulated base portion having a plurality of head leads, a plurality of circuit leads, and a plurality of conductive paths on a base surface of the base portion, the plurality of conductive paths electrically connecting the plurality of head leads and the plurality of circuit leads and the interconnect circuit including an alignment finger extending from the base portion including a first edge surface intersecting a second edge surface of the base portion having the plurality of circuit leads sequentially spaced therefrom and the first edge surface of the finger is longitudinally aligned with a third edge surface of the base portion to align the third edge surface with the surface of the interface circuit having the plurality of terminals thereon.

17. The combination of claim 16 wherein the interface circuit includes a slot having an end surface and the plurality of terminals are sequentially spaced from the end surface and the interconnect circuit is inserted into the slot and the second edge surface of the interconnect circuit is aligned with the end surface of the interface circuit to align the plurality of leads on the head interconnect circuit with the plurality of terminals on the interface circuit.

18. The combination of claim 17 wherein the first edge surface of the finger abuts the surface of the interface circuit to align the third edge surface of the base portion with the interface circuit.

19. The combination of claim 18 wherein the interface circuit includes a conductive substrate portion and an insulating portion having the plurality of terminals thereon and the first edge surface of the alignment finger aligns the third edge surface of the interconnect circuit with the insulating portion of the interface circuit.

\* \* \* \* \*